(12) United States Patent
Aljadeff et al.

(10) Patent No.: US 11,538,628 B2
(45) Date of Patent: Dec. 27, 2022

(54) SELF CALIBRATION BY SIGNAL INJECTION

(71) Applicant: Panoramic Power Ltd., Kfar-Saba (IL)

(72) Inventors: Daniel Aljadeff, Kiriat Ono (IL); Dan Wijsboom, Ganei Tikva (IL); Yael Alali, Tel Aviv (IL); Adi Shamir, Kidron (IL)

(73) Assignee: Panoramic Power Ltd., Kfar-Saba (IL)

( * ) Notice: Subject to any disclaimer, the term of this patent is extended or adjusted under 35 U.S.C. 154(b) by 127 days.

(21) Appl. No.: 16/952,922

(22) Filed: Nov. 19, 2020

(65) Prior Publication Data

US 2021/0166869 A1 Jun. 3, 2021

Related U.S. Application Data

(60) Provisional application No. 62/942,285, filed on Dec. 2, 2019.

(51) Int. Cl.
*H01F 38/30* (2006.01)
*H01F 27/28* (2006.01)
(Continued)

(52) U.S. Cl.
CPC ........... *H01F 38/30* (2013.01); *G01R 15/183* (2013.01); *G01R 15/186* (2013.01);
(Continued)

(58) Field of Classification Search
CPC .......... H01F 38/30; H01F 27/24; H01F 27/28; H01F 38/32; G01R 15/183; G01R 15/186;
(Continued)

(56) References Cited

U.S. PATENT DOCUMENTS

| 4,891,764 A | 1/1990 | McIntosh |
| 5,075,628 A | 12/1991 | Schuster et al. |

(Continued)

FOREIGN PATENT DOCUMENTS

| CN | 1790215 A | 6/2006 |
| CN | 101413995 A | 4/2009 |

(Continued)

OTHER PUBLICATIONS

International Search Report and Written Opinion of International Searching Authority for PCT/IB2020/060943, ISA/IL, Jerusalem, Israel, dated Feb. 21, 2021.

(Continued)

*Primary Examiner* — Giovanni Astacio-Oquendo
(74) *Attorney, Agent, or Firm* — M&B IP Analysts, LLC

(57) ABSTRACT

A current transformer (CT) for the purpose of, for example, current measurement, that uses a power line as a first coil and a second coil for measurement purposes, is further equipped with a third coil. Circuitry connected to the third coil is adapted to inject a known reference signal to the third coil of the CT. The injected reference signal, i.e., current, generates signals in the first and second coils of the CT. The signal generated in the second coil is compared using circuitry attached thereto to the reference signal. Based on the results, and the difference between the expected results and the actual results, updated calibration parameters are determined. These provide improved accuracy when using the CT, for example for measurement of the like of current or phase of the primary coil when measurements are adjusted using the newly determined calibration parameters.

19 Claims, 3 Drawing Sheets

(51) Int. Cl.
*H01F 27/24* (2006.01)
*H03M 1/12* (2006.01)
*H03M 1/66* (2006.01)
*G01R 35/00* (2006.01)
*G01R 15/18* (2006.01)
*G01R 19/18* (2006.01)
*G01R 19/22* (2006.01)
*H03H 7/06* (2006.01)
*G01R 19/00* (2006.01)
*G01R 35/04* (2006.01)

(52) U.S. Cl.
CPC ..... *G01R 19/0007* (2013.01); *G01R 19/0092* (2013.01); *G01R 19/18* (2013.01); *G01R 19/22* (2013.01); *G01R 35/005* (2013.01); *G01R 35/04* (2013.01); *H01F 27/24* (2013.01); *H01F 27/28* (2013.01); *H03H 7/06* (2013.01); *H03M 1/12* (2013.01); *H03M 1/66* (2013.01)

(58) Field of Classification Search
CPC .. G01R 19/0007; G01R 19/009; G01R 19/18; G01R 19/22; G01R 35/005; G01R 35/04; H03H 7/06; H03M 1/12; H03M 1/66
USPC ........................................ 324/120, 119, 76.11
See application file for complete search history.

(56) References Cited

U.S. PATENT DOCUMENTS

| | | | |
|---|---|---|---|
| 5,446,682 A * | 8/1995 | Janke | G01R 31/1272 340/650 |
| 5,450,328 A * | 9/1995 | Janke | G01R 31/42 702/65 |
| 5,995,911 A | 11/1999 | Hart | |
| 6,160,697 A | 12/2000 | Edel | |
| 6,279,115 B1 | 8/2001 | Baumgärtl et al. | |
| 6,577,111 B1 | 6/2003 | Dickmander et al. | |
| 7,305,310 B2 | 12/2007 | Slota et al. | |
| 7,557,563 B2 | 7/2009 | Gunn et al. | |
| 7,598,724 B2 | 10/2009 | Howell et al. | |
| 7,660,682 B2 | 2/2010 | Slota et al. | |
| 7,788,055 B2 | 8/2010 | Colsch et al. | |
| 8,073,642 B2 | 12/2011 | Slota et al. | |
| 8,193,732 B2 | 6/2012 | Ayala et al. | |
| 8,587,399 B2 | 11/2013 | Crutcher et al. | |
| 8,698,426 B1 | 4/2014 | Nguyen et al. | |
| 8,847,576 B1 | 9/2014 | Hannam et al. | |
| 9,134,348 B2 | 9/2015 | Shamir | |
| 9,411,003 B2 | 8/2016 | Danesh et al. | |
| 9,466,417 B2 | 10/2016 | Jefferies et al. | |
| 9,678,113 B2 | 6/2017 | Shamir et al. | |
| 9,678,114 B2 | 6/2017 | Shamir et al. | |
| 9,720,017 B2 | 8/2017 | Shamir et al. | |
| 9,720,018 B2 | 8/2017 | Shamir et al. | |
| 9,726,700 B2 | 8/2017 | Shamir | |
| 9,964,568 B2 | 5/2018 | Shamir et al. | |
| 10,345,419 B2 | 7/2019 | Neti et al. | |
| 10,666,279 B1 * | 5/2020 | Schurmann | H03M 1/1023 |
| 11,300,591 B2 * | 4/2022 | Boettcher | G01R 15/183 |
| 2003/0151415 A1 | 8/2003 | Randall et al. | |
| 2005/0122092 A1 | 6/2005 | Claret et al. | |
| 2005/0225909 A1 | 10/2005 | Yoshizaki et al. | |
| 2007/0096718 A1 | 5/2007 | Birlingmair et al. | |
| 2007/0136010 A1 | 6/2007 | Gunn et al. | |
| 2011/0246088 A1 * | 10/2011 | Santos | G01N 33/2841 702/24 |
| 2012/0101760 A1 | 4/2012 | Sutrave et al. | |
| 2013/0076343 A1 | 3/2013 | Carpenter et al. | |
| 2014/0340939 A1 | 11/2014 | Daly et al. | |
| 2015/0212159 A1 | 7/2015 | Lu | |
| 2016/0124024 A1 | 5/2016 | Jefferies et al. | |
| 2016/0334443 A1 | 11/2016 | Barczyk | |
| 2017/0176567 A1 | 6/2017 | Neti et al. | |
| 2018/0122549 A1 | 5/2018 | Lu | |
| 2018/0128859 A1 | 5/2018 | Shamir et al. | |
| 2018/0210014 A1 | 7/2018 | Long et al. | |
| 2019/0011283 A1 | 1/2019 | Soutar et al. | |
| 2021/0165066 A1 * | 6/2021 | Aljadeff | G01R 19/0007 |
| 2021/0311153 A1 | 10/2021 | Braginsky et al. | |

FOREIGN PATENT DOCUMENTS

| | | |
|---|---|---|
| CN | 103630724 A | 3/2014 |
| CN | 103901383 A | 7/2014 |
| CN | 104569897 A | 4/2015 |
| CN | 103630724 B | 10/2015 |
| CN | 204855773 U | 12/2015 |
| CN | 106405299 A | 2/2017 |
| CN | 106707026 A | 5/2017 |
| CN | 106908635 A | 6/2017 |
| CN | 107544045 A | 1/2018 |
| CN | 207117186 U | 3/2018 |
| CN | 106653336 B | 8/2018 |
| CN | 108957140 A | 12/2018 |
| CN | 209656769 U | 11/2019 |
| CN | 214337575 U | 10/2021 |
| DE | 102014108384 A1 | 12/2014 |
| EP | 2666023 B1 | 3/2015 |
| JP | 2001066329 A | 3/2001 |
| JP | 2001343404 A | 12/2001 |
| JP | 2019221075 A | 12/2019 |
| RU | 81335 U1 | 3/2009 |
| WO | 0017663 A2 | 3/2000 |

OTHER PUBLICATIONS

International Search Report and Written Opinion of International Searching Authority for PCT/IB2020/060980, ISA/IL, Jerusalem, Israel, dated Feb. 15, 2021.

\* cited by examiner

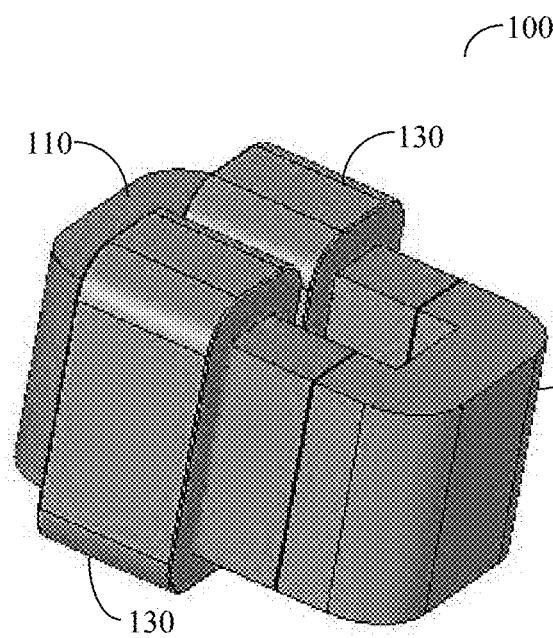 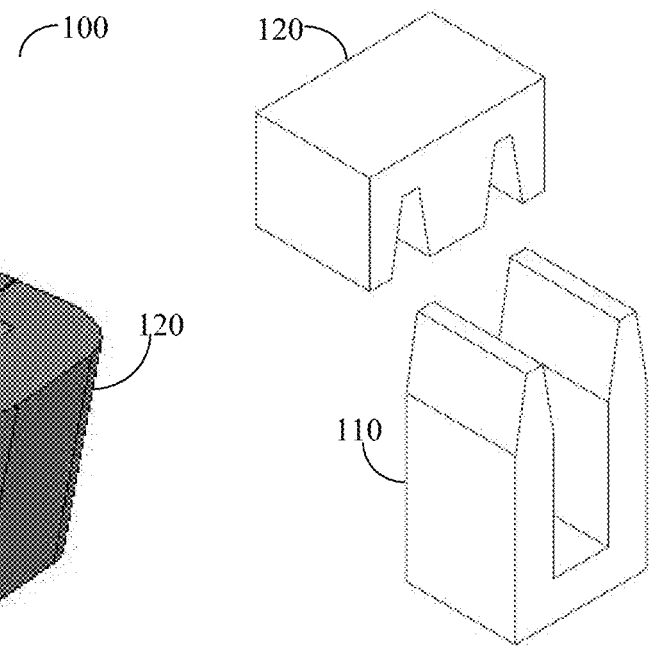
FIGURE 1A              FIGURE 1B
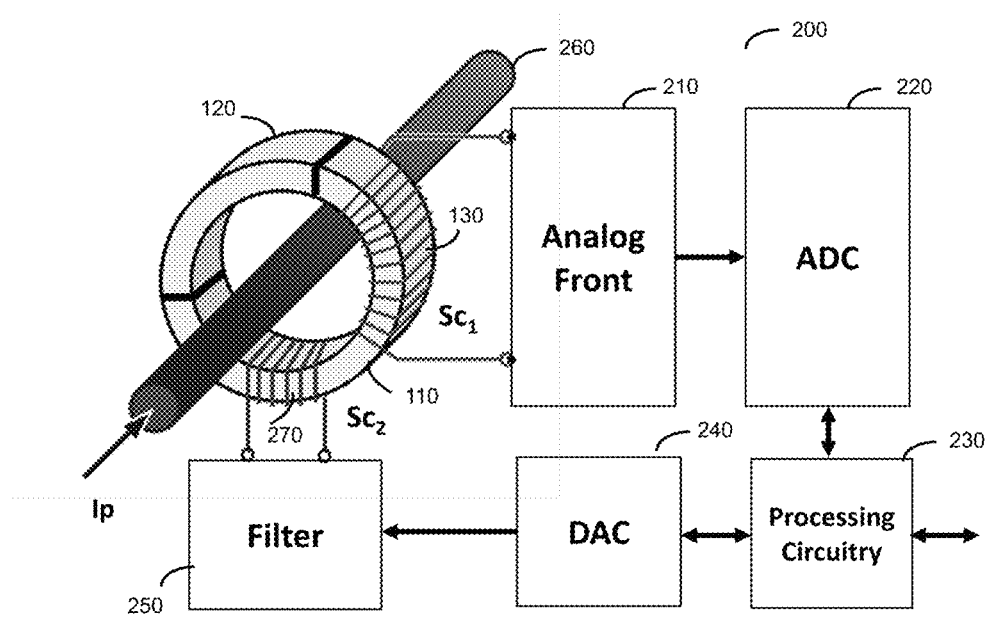
FIGURE 2

SELF CALIBRATION BY SIGNAL INJECTION

CROSS-REFERENCE TO RELATED APPLICATIONS

This application claims the benefit of U.S. Provisional Application No. 62/942,285, filed on Dec. 2, 2019, the respective contents of both being hereby incorporated by reference.

TECHNICAL FIELD

The disclosure generally relates to the calibration and error correction of current transformers (CT), and more particularly in split-core current transformers, used, for example, in non-intrusive and self-powered power sensors (SPPS).

BACKGROUND

In a typical electricity distribution system, power is provided through a main circuit breaker and a device for measurement of the power consumption of the entire electrical network connected thereto. However, typically, the main power line is then connected to a plurality of circuit breakers, each feeding a smaller section of the electrical network with its specific power requirements. The circuit breaker is adjusted to about the amount of maximum current that may be used by this electrical subnetwork. In industrial and commercial applications, hundreds of such circuit breakers may be installed, each controlling a section of the electrical network. Even in smaller locations, such as a house, it is not unusual to find tens of circuit breakers controlling various electrical subnetworks.

Non-intrusive measurement of current through a power line conductor has well known principles. A current transformer (CT) of sorts is created that comprises the primary winding as the power line conductor and the secondary providing an output current inversely proportionate to the number of windings. Typically such systems are used for measuring currents in very high voltage or current environments. Such types of apertures are useful for main power supplies. Using such devices, or power meters for that matter, is deficient for the purposes of measuring relatively low currents in an environment of a plurality of circuit breakers.

One of ordinary skill in the art would readily realize that split cores are used when non-intrusive installations of CTs is required, i.e., there is a need or requirement not to disconnect electrical wires when installing a CT. Example split-cores are shown in FIGS. 1A and 1B.

FIG. 1A depicts a schematic drawing of an assembled current transformer 100 having a split-core that comprised of elements 110 and 120. Also provided is a coil 130 wound around element 110 of the split-core. FIG. 1B shows a schematic drawing of a split core of the elements 110 and 120 of the split core of the CT 100 prior to assembly. A major problem with split core CT's is that the measurement result is highly sensitive to the air-gap that always exists between the two parts of the core. Due to production tolerances, there may be significant variations in the measurement result between seemingly identical cores due to, for example, miniature variations, which may be at an order of magnitude of tens of micro-meters, between their air-gaps. Such variations of the air-gaps may be the result of differences in the force applied to hold the respective split cores in place, dust accumulated in the gaps, different corrosion of the cores, humidity, and other factors that may impact the gap between the parts of the split core.

Moreover, such factors may also cause variations in the gap over time. As a result, such CT's cannot be practically used in applications requiring a high level of accuracy, such as, for example, revenue grade utility metering. Other sources of inaccuracy in CTs (not necessarily limited to those having a split core) are the number of winding which varies due to tolerances of the winding process, variations in the core cross section dimensions and magnetic material properties. One of ordinary skill in the art would readily appreciate that the cores are made of one or more ferromagnetic materials.

When using CT's to measure current, such inaccuracies are manifested in variations in the coupling factor, i.e., the ratio between primary and secondary signal amplitude, the position of the primary wire in respect to the CT, phase error, i.e., the phase shift between primary and secondary signal amplitudes, and temperature error coefficients, i.e., measurement errors due to variations in temperature. Several solutions have been proposed to the problem some of which involve manually configurable mechanical parts (such as variable resistors) assembled as part of the CT to tune the device. Others proposed solutions that include a matrix of passive components such as resistors, capacitors, and/or inductors, assembled as part of the CT. Such passive components are added and/or removed to tune the device.

Therefore, there is a need in the art to enable measurement and analysis of power consumption on a fine granularity at the device or circuit level.

Achieving a good accuracy in energy meter comprising CTs, often requires calibration of the meter and the CT. Identical CT's can very often vary in their response to current as well as in their inherent phase shift due to differences in manufacturing process of the core, coil wire winding etc. In many cases, the CT is provided separately from the meter, by a third party which is not the meter manufacturer and therefore calibrating the whole system becomes a very difficult task.

In addition to the difference between different CT's, individual CT's suffer from dynamic changes in their performance due to a different variables such as temperatures, and specifically in split core CT's, due to variable air gap.

It would be advantageous if a solution may be provided for self-calibration of CT's that is simple, cost effective and easy to maintain over long periods of time where the equipment is installed. It would be further advantageous to provide a self-calibration solution for a CT in general, and in particular a CT that includes a split core, when measuring electrical data.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

Certain embodiments disclosed herein include a system for self-calibration of a current transformer (CT). The system comprises a ferromagnetic core adapted to accommodate a current conducting wire passed therethrough, wherein the current conducting wire acts as a primary coil of the current transformer; a secondary coil wound around the ferromagnetic core, the secondary coil having a first connection point and a second connection point; a reference coil wound around the ferromagnetic core, the reference coil having a first connection point and a second connection point; an analog-to-digital converter (ADC), an analog front end (AFE), the analog front end coupling the ADC to a representation of an analog signal appearing across the first and second connection points of the secondary coil and the ADC providing as an output a digital signal representative of the analog signal appearing across the first and second connection points of the secondary coil; a digital-to-analog converter (DAC) providing an analog signal as an output in response to a digital signal received as an input; and a filter electrically coupling the analog output signal of the DAC to the first and second connection points of the reference coil, wherein the analog signal provided by the DAC passes from the DAC through the filter and the resulting filtered version of the analog signal provided by the DAC is in turn supplied between the first connection point and the second connection point of the reference coil; wherein the system is configured to determine, based on the digital signal generated by the ADC and responsive at least in part to a signal generated by the DAC in response to a digital version of a reference signal, whether there is at least one CT calibration parameter that is different by a predetermined threshold value from a previously stored version of that CT calibration parameter and if so updating at least one CT calibration parameter to a value that will reduce a measurement error caused by the CT when measuring a current flowing through the primary coil of the CT.

Certain embodiments disclosed herein include a method for self-calibration of a current transformer (CT). The method comprises the steps of injecting a reference coil of the CT with a first reference signal; sampling a secondary coil of the CT to measure its response to the first reference signal; and determining at least one calibration parameter of the CT which needs to be updated, wherein the determination is made based on at least the first reference signal and the samples at the secondary coil in response to the first reference signal.

Certain embodiments disclosed herein include a system for self-calibration of a current transformer (CT). The system comprises a digital-to-analog converter (DAC) adapted to inject a reference coil of the CT with a first analog reference signal generated in response to a corresponding digital representation of the first analog reference signal; an analog-to-digital converter (ADC) arranged to provide a digital measurement for a response to the first analog reference signal by a secondary coil of the CT; and circuitry, responsive to the digital representation of the first analog reference signal and the digital measurement for the response to the first analog reference signal by the secondary coil of the CT for use in determining at least one calibration parameter for the CT.

BRIEF DESCRIPTION OF THE DRAWINGS

The subject matter of the disclosure is particularly pointed out and distinctly claimed in the claims at the conclusion of the specification. The foregoing and other objects, features and advantages will become apparent and more readily appreciated from the following detailed description taken in conjunction with the accompanying drawings, in which:

FIG. 1A is a schematic drawing of an assembled current transformer having a split-core according to an embodiment;

FIG. 1B is a schematic drawing of a split core of the current transformer prior to assembly according to an embodiment;

FIG. 2 is a schematic drawing of a system including a current transformer and self-calibration circuitry according to an embodiment.

DETAILED DESCRIPTION

Figure 3:
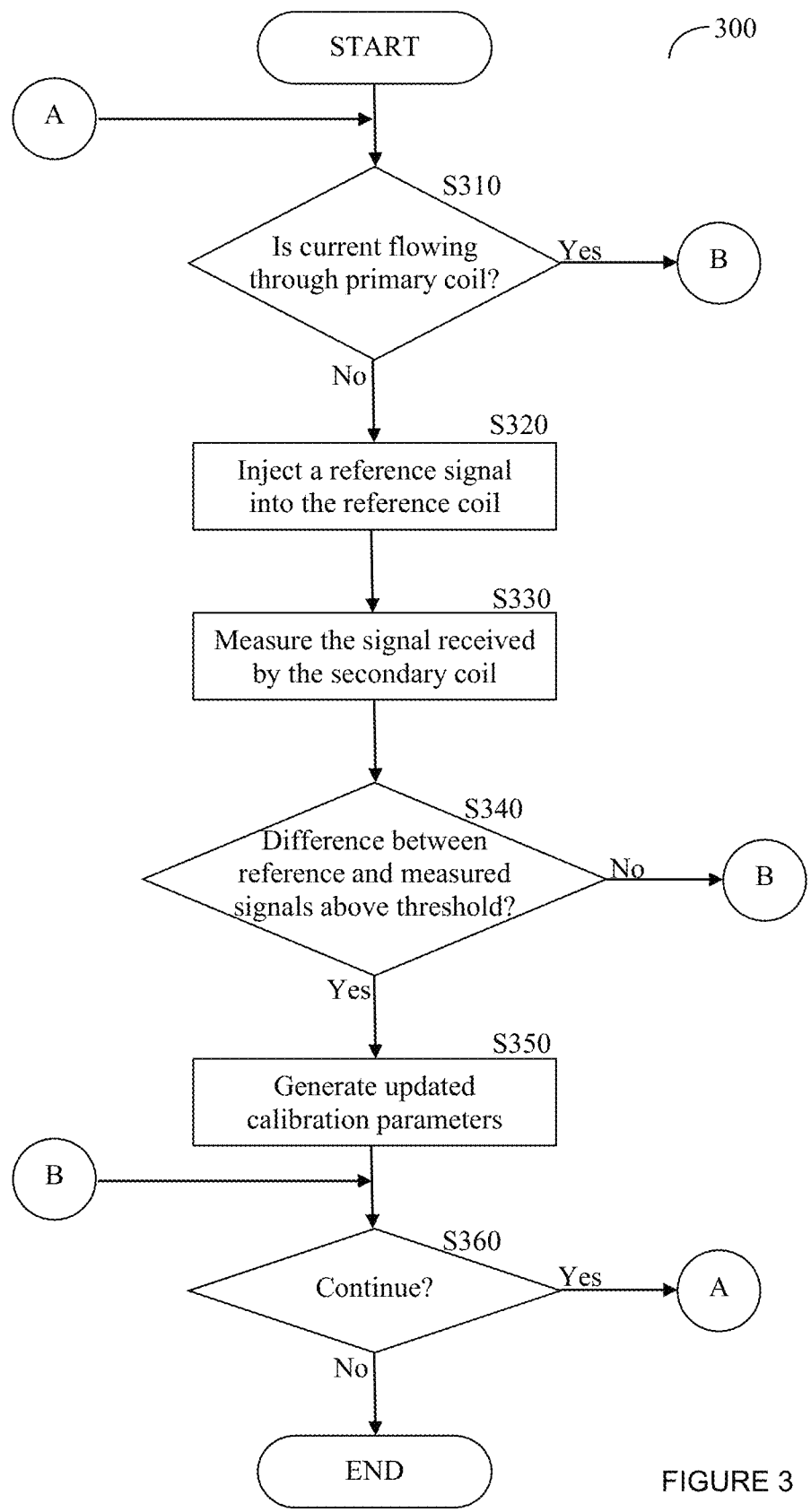
FIG. 3 is a flowchart of a self-calibrating current transformer according to an embodiment.

It is important to note that the embodiments disclosed herein are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality.

A current transformer (CT) for the purpose of, for example, current measurement, that uses a power line as a first coil and a second coil for measurement purposes, is further equipped with a third coil. Circuitry connected to the third coil is adapted to inject a known reference signal to the third coil of the CT. The injected reference signal, i.e., current, generates signals in the first and second coils of the CT. The signal generated in the second coil is compared using circuitry attached thereto to the reference signal. Based on the results, and the difference between the expected results and the actual results, updated calibration parameters are determined. These provide improved accuracy when using the CT, for example for measurement of the like of current or phase of the primary coil when measurements are adjusted using the newly determined calibration parameters.

FIG. 2 shows an example schematic drawing of a system 200 including a CT and self-calibration circuitry according to an embodiment. The CT includes a CT core that is made of a first element 110 and a second element 120 that are typically placed around a current line 260 that comprises a first coil of the CT, also referred to as a primary coil of the CT, the primary coil being a current conducting wire.

While a split-core CT is described herein it should be understood that the principles described herein are also applicable for non-split-core embodiments and therefore such cores should be considered an integral part of the description. A split-core may simply have more calibration needs than a non-split-core due to the airgap inherent to the split-core embodiment. It should be appreciated that the cores are made of one or more ferromagnetic materials. On the core, for example on element 110 there are wound two coils, the coil Sc1 130, also referred to as a secondary coil, and the coil Sc2 270, referred also herein as a reference coil.

The secondary coil 130 is electrically connected to an analog front-end (AFE) 210 which includes a burden resistor that captures the analog signal off the ports of the coil 130. The coil 130, as is well understood in the art, generates a current responsive and proportional to the current flowing through the current line 260. This current will generate a voltage on the burden resistor in the AFE 210. The generated voltage is then measured, through an electrical connection, to an analog-to-digital converter (ADC) that basically samples the analog signal into a series of numbers in ways well known in the art.

The ADC 220 is electrically connected to a processing circuitry 230, the processing circuitry may include, but is not limited to, a processor, a controller, volatile memory, non-volatile memory, logical gates, the like, and any combinations thereof. The processing circuitry 230 may, based on the sampled data received from the ADC 220, estimate the amplitude and the phase of the current flowing through the current line 260, compute power consumption and more, as further described in related prior art. However, due to CT losses (i.e. magnetizing impedance), estimating the amplitude and phase of the current line 260 is inaccurate.

A digital-to-analog converter (DAC) is electrically connected to the processing circuitry 230. Under the control of the processing circuitry 230 the DAC 240 receives series of numbers and converts these into an analog signal that is provided through a filter 250 to a third coil Sc2 270, also referred to as a reference coil, that is wound around the split-core of the CT, for example around element 110. According to an embodiment, at appropriate times of operation, a reference signal is generated under the control of the processing circuitry 230, and provided to the reference coil 270 as an AC reference signal, for short a reference signal, after being processed by the DAC 240 and the filter 250, all electrically connected as needed. One of ordinary skill in the art would readily appreciate that the filter 250 smooths out the high frequencies that are generated by the DAC 240 so as to create a smooth analog signal. In one embodiment, the current generated by the DAC 240 in the reference coil 270 and the current flowing through the current line 260, both generate a responsive current in the secondary coil Sc1 130. The voltage signal sampled by the ADC 220 will be proportional to the vector sum of both currents.

In one embodiment, the burden impedance further comprises inductive or capacitive elements. In one embodiment the reference signal is generated at times when the processing circuitry determines that a low or no current is flowing through the primary coil 260. In this case the current generated in the reference coil 270 will be the dominant current in the CT which as a result generates a signal responsive to the electromagnetic changes in the core. It is now possible for the processing circuitry 230 to perform a comparison between the reference signal and the signal received through the secondary coil 130. It can then estimate the internal parameters of the CT based on the response to the reference signal. Based on the estimated internal parameters of the CT, the CT calibration factors may be estimated. Those may include, but are not limited to, amplitude calibration (i.e., gain calibration), phase calibration (i.e., phase shift of the CT), frequency response, ratio correction factor (RCF), transformer correction factor (TCF), final correction factor (FCF), excitation current, saturation current and others. The calibration factors used may be then applied on the current measured when flowing through the primary coil 260 to offset any inaccuracies resulting from the CT and the environment it is operating in, which may include the effects of temperature and humidity but are not limited thereto.

In one embodiment the reference signal generated under the control of the processing circuitry 230 may be a sine wave, typically at the nominal frequency of the AC frequency of the current flowing through the primary coil 260. However, in an embodiment it is possible that the processing circuitry 260 generates sine waves at one or more different frequencies about the nominal frequency to check the performance of the calibration parameters which may be useful in cases where the current frequency through the primary coil 260 varies over time. In addition, different amplitudes may be also used to further check a broader spectrum of possible responses of the system 200.

In another embodiment the reference signal is provided while current is flowing through the primary coil 260 and added thereto. The combined signal generated in coil 130 is then sampled and processed by the processing circuitry 260. Still referring to the same embodiment, after a short time, the same reference signal may be shifted by 180 degrees, e.g., relative to the previous generated signal, and once again the combined signal generated in coil 130 is sampled and processed by the processing circuitry 260. Combining the sampled signals from both measurements, it's possible to better handle the influence of the current flowing through the primary coil 260. One of ordinary skill in the art will readily appreciate that additional reference schemes may be employed as well as a variety of combinations thereof.

In yet another embodiment, the CT calibration process is performed at different primary current amplitudes. The processing circuitry keeps the CT calibration parameters estimated for each primary current amplitude. The processing circuitry can then estimate the calibration parameters for any measured current by interpolating measured values or using any other mathematical method, well known to one of ordinary skill in the art. In a further embodiment, the same self-calibration principles are applied to a three-phase current transformer.

In one embodiment, the CT calibration parameters are periodically reported to a server (not shown), communicatively connected to the system 200, which compares the reported calibration parameters to previous parameters from the same CT and to parameters of similar CT's which may be further communicatively connected to the server. In an embodiment, the server is integrated in the system 200.

The server may then, make a decision if a CT is faulty or requires maintenance and make recommendations thereof. One of ordinary sill in the art would therefore readily appreciate that the described self-calibration process can also be used as a self-test tool. If for some reason, one or more of the estimated calibration parameters are essentially different from an expected parameter, it may be an indication that there is a CT failure. One of ordinary skill in the art would readily appreciate that the CT calibration process may be similarly employed on a CT that comprises multiple secondary coils without departing from the scope of the invention. In another embodiment more than two secondary coils may be used for the purpose of calibration without departing from the scope of the invention. That is, the description herein with respect of two secondary coils is for pedagogical reasons and is not intended to limit the scope of the invention.

FIG. 3 shows an example flowchart 300 of a self-calibrating CT according to an embodiment. At S310 it is checked if current is flowing through the primary coil 260 and if so execution continues with S360; otherwise, execution continues with S320. At S320 a reference signal, for example as described herein, is injected into the third coil 270. While in one embodiment a single kind of reference signal is used, however, in other embodiments different reference signals are injected so as to check the response of the system, for example system 200, to the injected any of the reference signals. This provides for the potential non-linearity of the system 200 performance. At S330 the signal received, for example, through secondary coil 130, AFE 210 and ADC 220, is measured, for example by the processing circuitry 230. At S340 it is checked whether a difference is found between the reference signal generated, for example, by the processing circuitry 230, and the received signal as determined by, for example, the processing circuitry 230. If the difference is above a predetermined threshold then execution continues with S350; otherwise, execution continues with S360. At S350 the calibration parameters are updated so as to ensure that when the same reference signal is provided again to the system 200 the difference will be below the predetermined threshold or at least equal thereto. At one embodiment a verification cycle (not shown) may be included to ensure that the new calibration parameters provide the expected results. At S360 it is checked whether to continue with the process of self-calibration and if so execution continues with S310; otherwise execution terminates.

While in the flowchart 300 a case of self-calibration of a CT system 200 while the first coil 260 has no current flowing there through, that is merely an example and should not be viewed as limiting on the scope of the invention. In one embodiment the self-calibration takes place while current is flowing through the primary coil 260. It should be appreciated that as the characteristics of the current flowing through the primary coil can be measured these can therefore be neutralized when checking the impact of the updated calibration parameters. Furthermore, in another embodiment both types of self-calibrations take place periodically so that a more precise determination of the calibration parameters is possible. In one embodiment of the invention in S320 and S330 it is possible to inject a reference signal twice, the second time arranging for the reference signal to be 180 degrees out of phase with respect to the first reference signal. The samples measure in both cases may be then used for the determination of the calibration parameters for an additional accuracy.

Figure 4A:
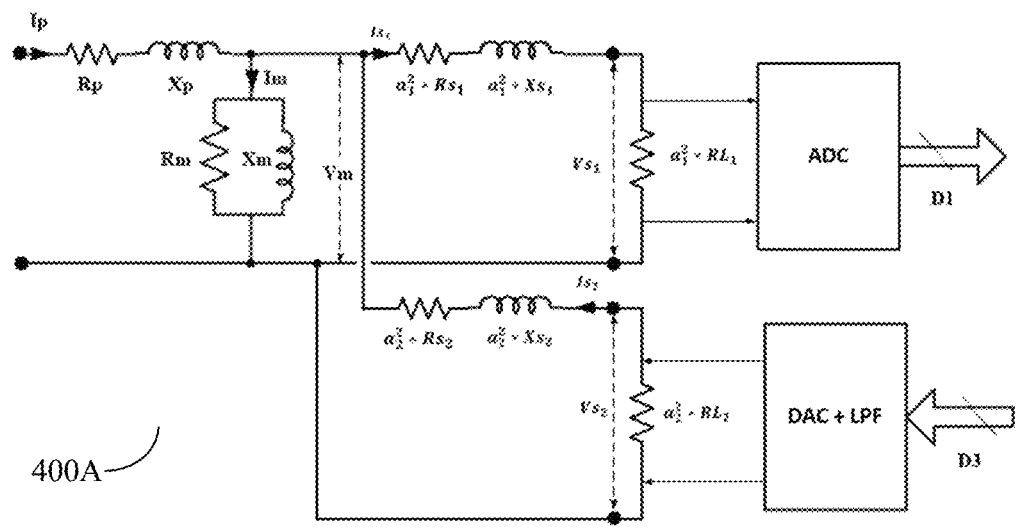
FIG. 4A is an equivalent circuit of a current transformer with two secondary coils and including their load resistors, when injecting a signal according to an embodiment; and, FIG. 4B is an equivalent circuit of a current transformer with two secondary coils and including their load resistors, when measuring an input signal according to an embodiment.

FIG. 4A shows an example equivalent circuit 400A of a CT with two secondary coils. All the impedances in circuit 400A are referred to the primary coil, although other equivalent circuits can also be used. The equivalent circuit 400A is used to compute the magnetizing impedance Zm of the CT. This is performed by applying a voltage Vs2 on the second secondary coil and measuring the voltage Vs1 (amplitude and phase related to VS2). Once Zm (i.e., the real Rm component and the imaginary Xm component) is known, Ip (amplitude and phase) can be determined by measuring Vs1. The total impedance Zms1 of the first secondary coil (including the load resistor Rl1) in parallel to the magnetizing impedance Zm, as referred to the primary can be described by the following equations:

$$Z_{ms1}[Re] = R_{ms1} = \frac{\frac{Rt_1}{a_1^2}*(R_m^2 + X_m^2) + \frac{X_m}{Zc_m}*(Rt_1^2 + Xs_1^2)}{\left(\frac{X_m}{a_1^2} + \frac{Rt_1}{Zc_m}\right)^2 + \left(\frac{R_m}{a_1^2} + \frac{Xs_1}{Zc_m}\right)^2}$$

$$Z_{ms1}[Im] = X_{ms1} = \frac{\frac{R_m}{Zc_m}*(Rt_1^2 + Xs_1^2) + \frac{Xs_1}{a_1^2}*(R_m^2 + X_m^2)}{\left(\frac{X_m}{a_1^2} + \frac{Rt_1}{Zc_m}\right)^2 + \left(\frac{R_m}{a_1^2} + \frac{Xs_1}{Zc_m}\right)^2}$$

For the sake of simplicity Zms1 is denoted as follows:

$$Z_{ms1} = R_{ms1} + jX_{ms1}$$

Where Rm is the CT's magnetizing resistance that comprises of: the Eddy current losses—resistive heating in the core: proportional to the square of voltage applied to the transformer; the hysteresis losses—energy needed to rearrange magnetic domains in the core: nonlinear function of the voltage applied to the transformer; and, the leakage flux—flux that escapes from the core and flux that passes through one winding only. It should be noted that the copper losses (resistive heating in the windings) are denoted by Rp, Rs1 and Rs2. Where Xm is the CT's magnetizing reactance that generates an additional phase shift between the current in the primary coil and the current in the secondary coils. Where Rl1 is the resistance of the load resistor connected to the first secondary coil. Where Rt1 is the resistance of the first secondary coil. Where Xs1 is the reactance of the first secondary coil. Also:

$$Z_m = Zc_m * (X_m + jR_m)$$

$$Zc_m = \frac{R_m * X_m}{R_m^2 + X_m^2}$$

$$a_1 = \frac{n_p}{ns_1}$$

$$Rt_1 = Rs_1 + Rl_1$$

The total impedance as referred to the primary measured from the second secondary coil (the coil where the signal Vs2 is injected) can be denoted as follow, noting that Rl2 is not included since Is2 does not depend on the value of Rl2:

$$Z_{ts2} = (R_{ms1} + a_2^2 * Rs_2) + j(X_{ms1} + a_2^2 * Xs_2)$$

$$Is_2 = \frac{Vs_2}{(R_{ms1} + a_2^2 * Rs_2) + j(X_{ms1} + a_2^2 * Xs_2)}$$

Where:

$$a_2 = \frac{n_p}{ns_2}$$

Having Is2 the value of Vm may be determined as follows:

$$V_m = Vs_2 * \left(1 - \frac{Rs_2 + jXs_2}{(R_{ms1} + a_2^2 * Rs_2) + j(X_{ms1} + a_2^2 * Xs_2)}\right)$$

And then:

$$Vs_1 = V_m * \left(\frac{Rl_1}{Rt_1 + jXs_1}\right)$$

Since Vs2 is known (injected signal) and Vs1 can be sampled and measured, we can easily compute using the above equations the actual values of Rm and Xm. For this calculation, both the amplitude of Vs1 and the relative phase of Vs1 in respect to Vs2 are used (the injected signal).

Figure 4B:
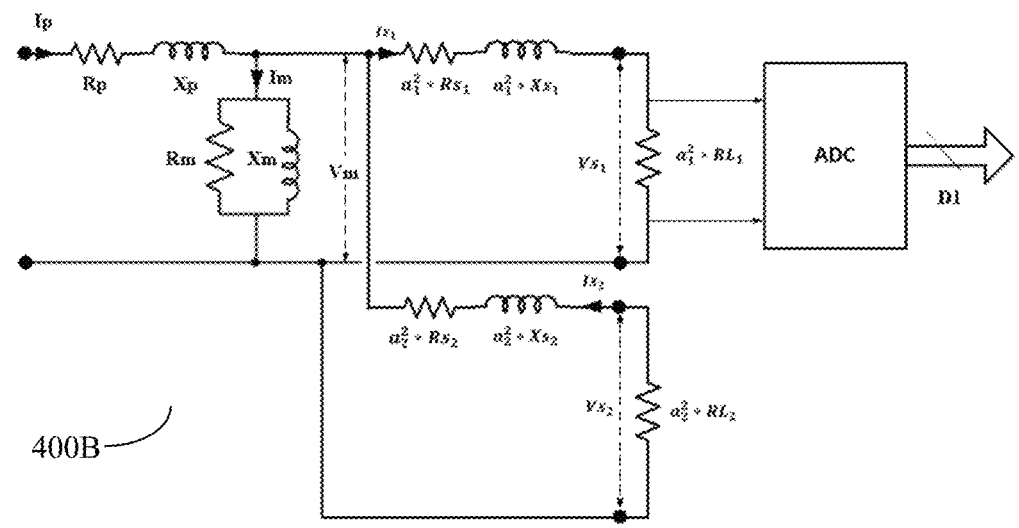

FIG. 4B shows an example equivalent circuit 400B of a CT with two secondary coils is depicted. In this case, no signal is applied on the second secondary coil. This equivalent circuit is used to compute the amplitude of Ip (the primary current) and its phase shift in respect to Is1. As in FIG. 4A, all the impedances in this circuit are referred to the primary coil, although other equivalent circuits can also be used.

The values of Rm and Xm can now be used to compute Ip as described herein. The total impedance Zs of both secondary coils and load resistor as referred to the primary can be denoted as following:

$$Z_s = K_n * \frac{(Rt_1 * Rt_2 - Xs_1 * Xs_2) + j(Xs_1 * Rt_2 + Xs_2 * Rt_1)}{(a_1^2 * Rt_1 + a_2^2 * Rt_2) + j(a_1^2 * Xs_1 + a_2^2 * Xs_2)}$$

Where:

$K_n = \alpha_1^2 + \alpha_2^2$ $Rt_1 = Rs_1 + Rl_1$ $Rt_2 = Rs_2 + Rl_2$

For the sake of simplicity, the above equation can be simplified to:

$Z_s = R_s + jX_s$

Where Rs is the total resistance of both secondary coils and load resistor as referred to the primary; and Xs is the reactance of both secondary coils and load resistor as referred to the primary.

The total CT impedance ZCT (the total impedance seen by Ip) as referred to the primary include Zs, the primary impedance Zp and the magnetizing impedance Zm. ZCT can be denoted as following:

$$Z_{CT} = Z_{CT}[Re] + jZ_{CT}[Im]$$

$$Z_{CT}[Re] = R_p + \frac{R_s * Zc_m * (R_m^2 + X_m^2) + X_m * (R_s^2 + X_s^2)}{(Zc_m * X_m + R_s)^2 + (Zc_m * R_m + X_s)^2}$$

$$Z_{CT}[Im] = X_p + \frac{R_m * (R_s^2 + X_s^2) + X_s * Zc_m * (R_m^2 + X_m^2)}{(Zc_m * X_m + R_s)^2 + (Zc_m * R_m + X_s)^2}$$

Where Rp is the resistance of the primary coil where in typical cases, the primary coil is a single wire passing through the CT core and the wire has a very low resistance which typically can be ignored; and, Xp is the reactance of the primary coil where in typical cases, the primary coil is a single wire passing through the CT core and the wire has a very low reactance (single turn) which typically can be ignored.

The primary current Ip is the vector sum of Im, Is1 and Is2. Since all the equivalent circuit components (i.e., resistances and reactances) are known, the value of the measured Vs1 can now be used to compute the amplitude of Ip and the phase of Ip in respect to Vs1. It should be appreciated that other equivalent circuits may be used, all of them providing the same basic information which allows estimating the magnetizing impedance of the CT.

It should be appreciated that the self-calibrating CT may be integrated within systems such as an analog front-end (AFE), a self-powered power sensor (SPPS), an energy meter and the like. In one embodiment self-calibrating CT may be used with a multi-phase CT, and in particular a 3-phase CT. Furthermore, it should be appreciated that the methods described herein for a self-calibrating CT may be applied to voltage transformers (VTs) without departing from the scope of the disclosed embodiments.

The various embodiments disclosed herein can be implemented as hardware, firmware, software, or any combination thereof. Moreover, the software is preferably implemented as an application program tangibly embodied on a program storage unit or computer readable medium consisting of parts, or of certain devices and/or a combination of devices. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such a computer or processor is explicitly shown. In addition, various other peripheral units may be connected to the computer platform such as an additional data storage unit and a display unit. Furthermore, a non-transitory computer readable medium is any computer readable medium except for a transitory propagating signal.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A system for self-calibration of a current transformer (CT) comprising:
    a ferromagnetic core adapted to accommodate a current conducting wire passed therethrough, wherein the current conducting wire acts as a primary coil of the current transformer;
    a secondary coil wound around the ferromagnetic core, the secondary coil having a first connection point and a second connection point;
    a reference coil wound around the ferromagnetic core, the reference coil having a first connection point and a second connection point;
    an analog-to-digital converter (ADC),
    an analog front end (AFE), the analog front end coupling the ADC to a representation of an analog signal appearing across the first and second connection points of the secondary coil and the ADC providing as an output a digital signal representative of the analog signal appearing across the first and second connection points of the secondary coil;

a digital-to-analog converter (DAC) providing an analog signal as an output in response to a digital signal received as an input; and a filter electrically coupling the analog output signal of the DAC to the first and second connection points of the reference coil, wherein the analog signal provided by the DAC passes from the DAC through the filter and the resulting filtered version of the analog signal provided by the DAC is in turn supplied between the first connection point and the second connection point of the reference coil;

wherein the system is configured to determine, based on the digital signal generated by the ADC and responsive at least in part to a signal generated by the DAC in response to a digital version of a reference signal, whether there is at least one CT calibration parameter that is different by a predetermined threshold value from a previously stored version of that CT calibration parameter and if so updating at least one CT calibration parameter to a value that will reduce a measurement error caused by the CT when measuring a current flowing through the primary coil of the CT.

2. The system of claim 1, further comprising processing circuitry and memory coupled thereto, wherein the processing circuitry supplying the digital version of the reference signal and receives the digital signal provided as output by the ADC.

3. The system of claim 2, wherein the processing circuitry is configured to make the determination and update the CT calibration parameters.

4. The system of claim 2, wherein the processing circuitry is further configured to generate a plurality of different ones of the reference signal.

5. The system of claim 2, wherein the processing circuitry is further configured to provide the digital version of the reference signal substantially immediately after a determination that no current is flowing through the primary coil.

6. The system of claim 1, wherein the filter smoothes the analog signal output by the DAC and supplies the resulting smoothed signal as the resulting filtered version of the analog signal provided by the DAC.

7. The system of claim 1, wherein the at least one CT calibration parameter is at least one of a CT phase-shift parameter and a CT magnitude parameter.

8. The system of claim 1, wherein the ferromagnetic core is a split-core.

9. A self-powered power sensor (SPPS) comprising the system of claim 1.

10. An energy meter comprising the system of claim 1.

11. The system of claim 1, wherein the system operates periodically to perform CT self-calibration.

12. The system of claim 1, wherein the CT at least one calibration parameter is stored in a server communicatively connected to the system.

13. The system of claim 12, wherein the server is further configured to compare the at least one CT calibration parameter to at least one of: a historical value of the at least a CT calibration parameter and at least a corresponding at least one CT calibration parameter of a CT having substantially the same design parameters as does the CT.

14. The system of claim 12, wherein the server is further configured to recommend at least a maintenance activity for the CT based on the comparison.

15. The system of claim 1, wherein the measurement error reduced is an error in measurement of at least one of: amplitude and phase.

16. A system for self-calibration of a current transformer (CT), the system comprising:

a digital-to-analog converter (DAC) configured to inject a reference coil of the CT with a first analog reference signal generated in response to a corresponding digital representation of the first analog reference signal;

an analog-to-digital converter (ADC) arranged to provide a digital measurement for a response to the first analog reference signal by a secondary coil of the CT; and circuitry, responsive to the digital representation of the first analog reference signal and the digital measurement for the response to the first analog reference signal by the secondary coil of the CT for use in determining at least one calibration parameter for the CT.

17. The system of claim 16, wherein the circuitry comprises a processor.

18. The system of claim 16, wherein DAC injects the first analog reference signal into the reference coil via a filter coupled between the DAC and the reference coil.

19. The system of claim 16, wherein the ADC receives the response to the first analog reference signal by the secondary coil via an analog front end coupled between the ADC and the secondary coil.

* * * * *